United States Patent [19]

Matsuoka et al.

[11] Patent Number: 5,397,682
[45] Date of Patent: Mar. 14, 1995

[54] POLYIMIDE PRECURSOR AND PHOTOSENSITIVE COMPOSITION CONTAINING THE SAME

[75] Inventors: Yoshio Matsuoka; Yoshiaki Kawai; Hideo Koizumi, all of Fuji, Japan

[73] Assignee: Asahi Kasei Kogyo Kabushiki Kaisha, Osaka, Japan

[21] Appl. No.: 196,189
[22] PCT Filed: Aug. 31, 1993
[86] PCT No.: PCT/JP93/01229
   § 371 Date: Aug. 26, 1994
   § 102(e) Date: Aug. 26, 1994
[87] PCT Pub. No.: WO94/06057
   PCT Pub. Date: Mar. 17, 1994

[30] Foreign Application Priority Data

Sep. 2, 1992 [JP] Japan .................. 4-257582

[51] Int. Cl.$^6$ .............. G03F 7/038; C08G 73/12
[52] U.S. Cl. .................. 430/283; 430/286; 430/287; 522/142; 522/164; 528/353
[58] Field of Search .......... 528/353; 522/164; 430/283, 286, 287

[56] References Cited

U.S. PATENT DOCUMENTS 4,548,891 10/1985 Riediker ..................... 430/287
5,310,625 5/1994 Angelopoulos .............. 430/283

Primary Examiner—David Buttner
Attorney, Agent, or Firm—Pennie & Edmonds

[57] ABSTRACT

Disclosed is a novel polyimide precursor having an aromatic polyamide ester structure containing amido groups and carboxylic acid ester groups composed of carboxylic groups and organic groups bonded thereto by ester linkage, wherein the ester groups comprise 20 to 80 mole %, based on the total molar amount of the ester groups, of groups each independently selected from the group consisting of a methyl group, an ethyl group, an n-propyl group, an isopropyl group and an allyl group and 20 to 80 mole %, based on the total molar amount of the ester groups, of organic groups each independently selected from organic groups having 4 to 11 carbon atoms and containing a terminal ethylenic double bond. The polyimide precursor of the present invention has excellent pattern forming properties and can be converted by heating to a cured polyimide resin having excellent mechanical properties including excellent elongation, and a high water resistance and, therefore, is useful as a raw material for the production of electrical and electronic parts, such as semiconductor devices, multi-layer wiring boards, etc. Disclosed is also a photosensitive resin composition containing this novel polyimide precursor, which is particularly useful for forming a patterned polyimide resin film with a high pattern resolution.

7 Claims, No Drawings

POLYIMIDE PRECURSOR AND PHOTOSENSITIVE COMPOSITION CONTAINING THE SAME

TECHNICAL FIELD

The present invention relates to a polyimide precursor. More particularly, the present invention is concerned with a novel polyimide precursor having an aromatic polyamide ester structure containing amido groups and carboxylic acid ester groups composed of carboxylic groups and organic groups bonded thereto by ester linkage. The ester groups of the polyimide precursor are essentially of two types, depending on the structure of the organic group of the ester group, and their distribution in the polymer chain is characteristic of the polyimide precursor. The polyimide precursor of the present invention has excellent pattern-forming properties and can be converted by heating to a cured polyimide resin having excellent mechanical properties including high elongation properties, and is therefore useful as a raw material for the production of electrical and electronic parts, such as semiconductor devices, multilayer wiring boards, etc. The present invention is also concerned with a photosensitive resin composition containing this novel polyimide precursor, which is particularly useful for forming a patterned polyimide resin film having excellent mechanical properties and a high water resistance as well as a high pattern resolution.

BACKGROUND ART

Polyimide resins have excellent thermal and chemical stabilities, low dielectric constants, and excellent planar contour-forming ability and, thus, have been attracting attention in the microelectronics industries. Polyimide resins have been widely used as materials for a surface-protective film or an interlayer insulating film for semiconductor devices, or as materials for multichip modules.

Generally, the process for forming a polyimide coating film in a desired pattern, for example, on a semiconductor device, is complicated. The process includes the steps of half-curing a polyimide precursor applied on, for example, a semiconductor device by heating, forming a pattern of a photoresist on the half-cured polyimide coating film, etching the polyimide coating film using the photoresist pattern as a mask, subsequently peeling-off the used photoresist pattern on the polyimide coating film, and subjecting the polyimide coating film on the semiconductor device again to heat treatment for imparting desired physical properties to the polyimide coating film. In such a complicated process, setting and controlling of various conditions for each step are difficult to perform satisfactorily, so that reproducibility is likely to be poor with respect to the physical properties of the resultant coating films. Further, the process has other drawbacks in that the pattern resolution is unsatisfactory because of indirect patterning, and that a hazardous substance, such as hydrazine, is used in the etching step.

Therefore, in recent years, for obtaining a pattern of a polyimide coating film, a method has been proposed, in which a polyimide precursor containing a photopolymerizable functional group is used. This method comprises forming a coating of a photosensitive composition containing the above polyimide precursor, a photopolymerization initiator, etc., photo-curing the formed coating, subjecting the photo-cured coating to developing to obtain a pattern coating, and then heating the pattern coating to convert the polyimide precursor to a polyimide resin. The polyimide precursor used in such a technique is generally referred to as "photosensitive polyimide precursor". The technique is described in detail in R. Rubner, H. Ahne, E. Këhn and G. Kolodziej, Photographic Science and Engineering, Vol. 23, No. 5, 303 (1979). By employing this technique, the drawbacks in the above-mentioned conventional process using a non-photosensitive polyimide precursor polymer have been overcome. Therefore, employment of this technique in obtaining patterns of polyimide coating films has been increasing.

Recently, however, demands for higher resolution in patterning a polyimide on a semiconductor device or the like have increased. In conventional processes using a non-photosensitive polyimide precursor polymer, the resolution in patterning is not so high and, therefore, semiconductor devices themselves and processes for manufacturing the same have been designed so as to take this into account. On the other hand, along with use of a photosensitive polyimide precursor polymer, which is capable of providing higher resolution in patterning, new semiconductor devices and processes, which utilize patterns of high resolution, have been developed.

The following is an example of utilization of high resolution polyimide patterns. In the manufacture of memory elements etc., in order to increase productivity, commonly employable circuits are first formed and, after inspection of the memory elements etc., unnecessary circuit portions are cut-off. In a conventional process using a non-photosensitive polyimide precursor polymer, this cutting step is conducted before forming the polyimide patterns. On the other hand, with the use of a photosensitive polyimide precursor polymer, it has become possible to obtain high resolution patterning of the polyimide. Therefore, in forming polyimide patterns on circuits, appropriate holes are first formed in the polyimide pattern film, so that cutting of unnecessary circuit portions can be performed through the holes after the formation of the polyimide pattern film. The cutting-off of unnecessary circuit portions after forming polyimide patterns enables the yield of products to be improved, since the timing of the cutting-off of the unnecessary circuit portions is closer to the finishing of fabrication for final products.

In such applications of polyimide precursors as described above, the holes to be utilized for cutting unnecessary circuit portions are required to be small for achieving high density circuit integration of the elements. Accordingly, the demand for photosensitive polyimide precursor compositions capable of providing polyimide patterns having higher resolutions than those currently achievable has increased. With a photosensitive polyimide precursor capable of providing a high resolution pattern, a wide process margin for patterning can be achieved, which is necessary for obtaining a high degree of integration and a high accuracy in the production of semiconductor devices. "Wide process margin for patterning" refers to a process that furnishes patterns that changes little with changes in process conditions, such as period in patterning, temperature, etc. Therefore, the higher the resolution, the better the results. This can also apply to the use of polyimide patterns to produce other elements, such as multichip modules etc. Accordingly, the demand for photosensitive polyimide precursor compositions, which are capable of providing polyimide patterns of high resolution and high accuracy, has increased. Since the required polyimide films tend to be thick and the required printed circuits tend to be more multiple in layer structure and more dense, the production of high resolution polyimide patterns is technically demanding.

Further, in recent years, better mechanical properties, especially a high elongation, have been desired with respect to polyimide coating films. In the conventional method for the production of, for example, semiconductor devices, a polyimide coating film is unlikely to suffer from stress, since there is conventionally employed a process in which a semiconductor chip having a polyimide film formed thereon is placed on a lead frame, followed by bonding therebetween, so that the polyimide film is unlikely to suffer from being loaded. However, when the recent mode of the method of the production of semiconductor devices is used, a polyimide coating film is likely to suffer from high stress since, in accordance with the requirement for miniaturization of semiconductor devices, a lead frame is placed on the semiconductor chip having the polyimide pattern formed thereon, in contrast to the case of the conventional mode, followed by bonding of the lead frame and the semiconductor chip, so that the polyimide film is inevitably likely to suffer from being loaded. Furthermore, regarding the production of multichip modules, electrical connector pins have been miniaturized and, along with the increased density of integrated circuits in the modules, portions of the polyimide coating film which serve to attach the pins thereto have become small in area, thereby causing the pin-attaching portions of the polyimide coating film to suffer from excessive stress. For coping with this problem, photosensitive polyimide precursor compositions capable of providing polyimide film patterns having a high elongation have been desired.

It has been known that when a polyimide resin is subjected to boiling testing, the properties of the polyimide resin are likely to deteriorate, so that the mechanical strengths thereof and the adhesion strength thereof to substrates are lowered, leading to a lowering in reliability of semiconductor devices produced using a polyimide resin. Accordingly, the demand for photosensitive polyimide precursor compositions capable of providing polyimide patterns having a high water resistance, has increased.

As described above, in order to cope with various problems occurring in connection with the development of integrated circuits of high density, high accuracy and high multiplicity in layer structure, the demand for photosensitive polyimide precursor compositions capable of providing polyimide pattern films having good mechanical properties including high elongation, high water resistance, and high pattern resolution, has increased.

Compounds referred to as "photosensitive polyimide precursor" can be grouped in a number of classes, according to their polymer backbone structures, types of photosensitive groups, etc. The compounds are described in detail in "Polymers for Microelectronics", Proceedings of the International Symposium on "Polymers for Microelectronics—Science and Technology—" (PME '89), Tokyo, Japan, Oct. 29 to Nov. 2, 1989, edited by Y. Tabata et al. [VCH: Weinheim, N.Y., Cambridge and Basel (1990)], pp. 789–810.

Examples of photosensitive polyimide precursors and systems using the same include a polyimide precursor having a polyamide chain with photosensitive groups bonded thereto by ionic bonds (Japanese Patent Publication No. 59-52822 by Hiramoto et al.); a mixture system in which a reactive monomer is mixed with a polyamide acid ["Kobunshi-Gakkai Yokoshu (Polymer Preprints, Japan), Vol. 39, No. 8, pp. 2397 (1990)" by Sashida et al.]; a system in which a polyamide acid partially esterified with a photosensitive group is adapted for development in an aqueous system (Japanese Patent Application Laid-Open Publication No. 3-220558, corresponding to EP 421,195 A, by A. E. Nader et al.); and the like. However, with a system using a polyimide precursor containing carboxylic acid residues, the photosensitive composition is not satisfactorily stable, leading to poorly reproducible results. That is, the conventional polyimide precursors are not useful because a difference in solubility between light-exposed portions and non-exposed portions of the polyimide precursor is not satisfactory, so that not only is the polyimide precursor of the light-exposed portions likely to be partially dissolved at the time of development, but also the precursor polymer thus dissolved precipitates on the developed pattern film upon contacting with a rinsing liquid. Therefore, high-resolution polyimide pattern films cannot be obtained with high accuracy and reproducibility.

In this situation, the present inventors have conducted extensive and intensive studies with respect to a polyimide precursor having an aromatic polyamide ester structure, which can obviate the above-described drawbacks of the prior art.

Photosensitive compositions using a polyimide precursor having an aromatic polyamide ester structure have been known and disclosed in, e.g., R. Rubner et al., "Photograph. Sci. Eng., No. 23, pp. 303 (1979)"; M. T. Pottinger et al., "The 38th Electric Components Conference, pp. 315 (1988)", etc. In each of these compositions, a polyamide ester having only 2-methacryloyloxyethyl group (containing a terminal ethylenic double bond) bonded thereto by ester linkage is employed.

Polyamide esters having groups (containing no terminal ethylenic double bond) bonded thereto by ester linkage have also been known, which are disclosed in, e.g., Okabe et al., "Kobunshi-Gakkai Yokoshu (Polymer Preprints, Japan), Vol. 41, No. 2, pp. 357 (1992)". A photosensitive composition using a polyamide ester having bonded thereto groups containing no terminal ethylenic double bond by ester linkage is disclosed in Matsuoka et al., Japanese Patent Application Laid-Open Publication No. 61-72022 (corresponding to Canadian Patent (A) No. 1 246 291).

The compositions disclosed by R. Rubner et al. and Pottinger et al. are similar to the above-mentioned photosensitive polyimide precursor compositions which are currently used mainly in the fields of semiconductor devices etc., but are not satisfactory with respect to not only resolution, but also elongation and water resistance of polyimide pattern coating films obtained therefrom, as described above. The above-mentioned composition disclosed by Matsuoka et al. has drawbacks in that the sensitivity to U.V. light is low, due to the low degree of photo-crosslinking even upon light exposure, and that the difference in solubility between light-exposed portions and non-exposed portions is small, so that not only are the light-exposed portions of the photosensitive composition likely to be partially dissolved at the time of development, but also the polyimide precursor thus dissolved precipitates on the developed pattern film upon contacting with a rinsing liquid, leading to a lowering in resolution of the resultant pattern. Thus, the known compositions are inappropriate for practical use.

DISCLOSURE OF THE INVENTION

The present inventors have conducted extensive and intensive studies with a view toward developing a novel polyimide precursor having an aromatic polyamide ester structure, which is not only free of the above-mentioned drawbacks inevitably accompanying the prior art polyimide precursors, but also has excellent properties desired in the art. As a result of these studies, polyimide precursors having all of the desirable properties have been unexpectedly discovered. These polyimide precursors have an aromatic polyamide ester structure, containing amido groups and carboxylic acid ester groups. The ester groups of the precursors are essentially of two structural types, depending on the structure of their organic group, and are characteristically distributed in the polymer chains as follows: the ester groups in the polymer chain comprise (1) 20 to 80 mole %, based on the total molar amount of the ester groups, of groups each independently selected from the group consisting of a methyl group, an ethyl group, an n-propyl group, an isopropyl group and an allyl group and (2) 20 to 80 mole %, based on the total molar amount of the ester groups, of organic groups each independently selected from groups having 4 to 11 carbon atoms and containing a terminal ethylenic double bond.

A polyimide pattern is obtained by heat-curing the above-mentioned polyimide precursor, which has desirable mechanical properties including high elongation and an excellent water resistance as well as an excellent pattern resolution, as compared to the conventional, polyamide ester type polyimide precursors containing ester groups whose organic groups belong to either of the above group (1) or (2).

The present invention has been completed, based on these novel findings.

It has also unexpectedly been found that when as group (2) mentioned above, an organic group having 4 to 11 carbon atoms and containing a terminal ethylenic double bond and an amido linkage, and an organic group having 4 to 11 carbon atoms and containing a terminal ethylenic double bond and no amido linkage are used in combination in a specific molar ratio, the excellent effect of the present invention can be even more markedly exerted.

The present invention has been completed, based on these novel findings.

Accordingly, it is an object of the present invention to provide a novel polyimide precursor, which has excellent pattern-forming properties and can be converted by heating to a cured polyimide resin having not only excellent mechanical properties, including high elongation properties, but also high moisture resistance.

It is another object of the present invention to provide a photosensitive resin composition containing this novel polyimide precursor, which is capable of providing a patterned polyimide resin film having excellent mechanical strengths and a high moisture resistance as well as a high pattern resolution.

In one aspect of the present invention, there is provided a polyimide precursor comprising recurring units represented by the following formula (I):

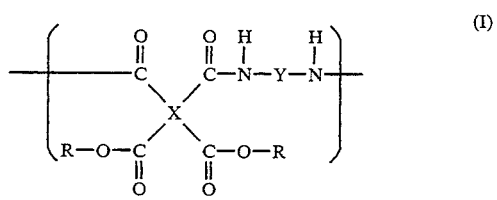

wherein X represents a tetravalent aromatic group having 4 to 24 carbon atoms;

Y represents a divalent aromatic group having 4 to 36 carbon atoms; and the R groups comprise 20 to 80 mole %, based on the total molar amount of the R groups, of $R^1$ groups and 20 to 80 mole %, based on the total molar amount of the R groups, of $R^2$ groups;

the $R^1$ groups being each independently selected from the group consisting of a methyl group, an ethyl group, an n-propyl group, an isopropyl group and an allyl group;

the $R^2$ groups being each independently selected from organic groups having 4 to 11 carbon atoms and containing a terminal ethylenic double bond; and wherein each of the —COOR groups is bonded to X at the ortho-position relative to the respective neighboring —CONH— group.

The polyimide precursor has a viscosity of from 1 to 1,000 poises as measured at 23° C. with respect to a 30% by weight solution of the precursor in N-methyl-pyrrolidone.

In another aspect of the present invention, there is provided a photosensitive composition which is a varnish comprising (A) the above-mentioned polyimide precursor, (B) a photopolymerization initiator and (C) a solvent for components (A) and (B).

In the present invention, known processes can be employed for producing a polyimide precursor having an aromatic polyamide ester structure. Examples of such processes include a process disclosed in the above-mentioned R. Rubner et al. reference, a process disclosed in the above-mentioned Pottinger et al. reference, a process disclosed in the above-mentioned Matsuoka et al. reference (Canadian Patent (A) No. 1,246,291), a process disclosed in L. Minnema et al., "Polym. Eng. Sci., Vol. 28, No. 12, pp. 815 (1988)", a process disclosed in Matsuoka et al., Japanese Patent Application Laid-Open Publication No. 61-127731 (corresponding to U.S. Pat. No. 4,754,016).

Among the above-mentioned processes, the process disclosed in Matsuoka et al., Canadian Patent (A) No. 1,246,291 is the most preferred, because the content of ionic impurities in the polyimide precursor obtained is very small, a desired polyamide ester structure can be produced in high purity, and the storage stability of a photosensitive composition obtained using the polyimide precursor is very excellent.

In any of the above mentioned processes, as raw materials to be used for the production of a polyimide precursor having an aromatic polyamide ester structure, essentially the following three types of materials are used: (a) a tetracarboxylic acid or a derivative thereof, (b) a diamine or a derivative thereof, and (c) an alcohol or a derivative thereof. In addition to the these raw materials, a dehydrating condensation agent can be used, depending on the production process employed.

The raw materials to be used for the production of the polyimide precursor of the present invention are not specifically limited, as long as they are of types (a), (b) and (c) mentioned above. However, from the viewpoints of desired heat resistance and mechanical strength of a polyimide coating film obtained by heat treatment of a photosensitive composition containing the polyimide precursor, it is preferred that an aromatic tetracarboxylic acid be used as the tetracarboxylic acid (a) above, and an aromatic diamine be used as the diamine (b) above. In conventional processes, a silicon-containing diamine or the like is sometimes used as a comonomer for improving the strength of the adhesion of the polyimide coating film to a substrate. However, use of a silicon-containing diamine in the present invention is undesirable, because when it is used in addition to the raw materials described in (a), (b) and (c) above, the solubility of a polyimide precursor becomes too high at the time of development, thus lowing the resolution of patterning; and furthermore the elongation of the polyimide obtained by heat curing of the polyimide precursor is lowered.

Tetracarboxylic acids or derivatives thereof (a) usable in the present invention are not specifically limited, as long as they can be used for synthesis of a polyimide precursor. However, from the viewpoint of ease in conducting the synthetic reaction, a tetracarboxylic dianhydride is preferred. A tetracarboxylic dianhydride usable in the present invention is represented by the following formula (II):

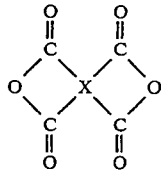
(II)

wherein X represents a tetravalent aromatic group having 4 to 24 carbon atoms.

Representative examples of tetracarboxylic dianhydrides include pyromellitic dianhydride, 3,3',4,4'-benzophenonetetracarboxylic dianhydride, 3,3',4,4'-biphenyltetracarboxylic dianhydride, 3,3',4,4'-diphenylethertetracarboxylic dianhydride, 3,3',4,4'-diphenylsulfonetetrecarboxylic dianhydride, and 2,2-bis(3,4-dicarboxyphenyl)-1,1,1,3,3,3-hexafluoropropane dianhydride. These tetracarboxylic dianhydrides can be used individually or in combination.

As diamines or derivatives thereof (b) usable in the present invention, it is preferred to use a diamine per se, although a suitable diamine derivative, e.g., a trimethylsilylated diamine, can be used. A diamine usable in the present invention is represented by the following formula:

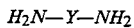
(III)

wherein Y represents a divalent aromatic group having 4 to 36 carbon atoms.

Representative examples of diamines include p-phenylenediamine, m-phenylenediamine, 4,4'-diaminodiphenyl ether, 4,4'-diaminodiphenyl sulfide, 4,4'-diaminobenzophenone, 3,4'-diaminodiphenyl ether, 4,4'-diaminodiphenyl sulfone, 3,3'-diaminodiphenyl sulfone, 4,4'-diaminodiphenyl sulfoxide, 3,3'-dimethyl-4,4'-diaminobiphenyl, 3,3'-dimethoxy-4,4'-diaminobiphenyl, 3,3'-dichloro-4,4'-diaminobiphenyl, 1,4-bis(4-aminophenoxy)benzene, 1,3-bis(4-aminophenoxy)benzene, 1,3-bis(3-aminophenoxy)benzene, bis[4-(4-aminophenoxy)phenyl]sulfone, bis[4-(3-aminophenoxy)phenyl]sulfone, 4,4'-bis(4-aminophenoxy)biphenyl, 4,4'-bis(3-aminophenoxy)biphenyl, bis[4-(4-aminophenoxy)phenyl]ether, 1,4-bis(4-aminophenyl)benzene, 9,10-bis(4-aminophenyl)anthracene, 1,1,1,3,3,3-hexafluoro-2,2-bis(4-aminophenyl)propane, 1,1,1,3,3,3-hexafluoro-2,2-bis[4-(4aminophenoxy)phenyl]propane and 1,1,1,3,3,3-hexafluoro-2,2-bis(3-amino-4-methylphenyl)propane. These diamines can be used individually or in combination.

Examples of alcohols or derivatives thereof (c) to be used in the present invention include various types of alcohols mentioned below. An activated alcohol derivative which is used in the above-mentioned L. Minnema et al. reference can also be used.

As mentioned above, the polyimide precursor of the present invention comprises recurring units represented by the following formula (I):

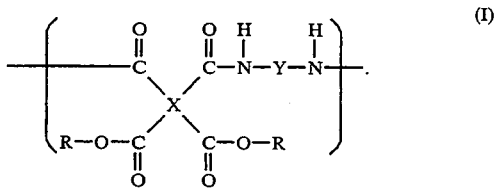

In formula (I), X represents a tetravalent aromatic group having 4 to 24 carbon atoms; Y represents a divalent aromatic group having 4 to 36 carbon atoms; and the R groups comprise 20 to 80 mole %, based on the total molar amount of the R groups, of $R^1$ groups and 20 to 80 mole %, based on the total molar amount of the R groups, of $R^2$ groups, wherein the $R^1$ groups are each independently selected from the group consisting of a methyl group, an ethyl group, an n-propyl group, an isopropyl group and an allyl group; and the $R^2$ groups are each independently selected from organic groups having 4 to 11 carbon atoms and containing a terminal ethylenic double bond. Accordingly, as alcohols for producing the polyimide precursor of the present invention, it is necessary to use at least 2 classes of alcohols corresponding to the $R^1$ groups and the $R^2$ groups in specific proportions.

As the first class of alcohol which corresponds to $R^1$, at least one alcohol selected from the group consisting of methyl alcohol, ethyl alcohol, n-propyl alcohol, isopropyl alcohol and allyl alcohol is used in an amount of from 20 to 80 mole %, based on the total molar amount of the alcohols used. Among these alcohols, methyl alcohol and/or ethyl alcohol are preferred because the use of such a type of alcohol is most effective for exerting the desired effects of the present invention.

As the second class of alcohol which corresponds to $R^2$, at least one alcohol having 4 to 11 carbon atoms and containing a terminal ethylenic double bond is used in an amount of from 20 to 80 mole %, based on the total molar amount of the alcohols used. Representative examples of the second class of alcohols include 2-methacryloyloxyethyl alcohol, 2-acryloyloxyethyl alcohol, 1-methacryloyloxy-2-propyl alcohol, 1-acryloyloxy-2-propyl alcohol, 2-methacrylamidoethyl alcohol, 2-acrylamidoethyl alcohol, methylol vinyl ketone, 2-hydroxyethyl vinyl ketone, 1,3-diacryloyloxy-2-propyl alcohol and 1,3-dimethacryloyloxy-2-propyl alcohol. These alcohols can be used alone or in combination. Among these alcohols, an alcohol having 5 to 7 carbon atoms is preferred because the use of such a type of alcohol is most effective for exerting the desired effects of the present invention.

Furthermore, as the second class of alcohol which corresponds to $R^2$, when an alcohol containing an amido linkage (which corresponds to $R^{2-1}$) is used in an amount of from 5 to 40 mole %, based on the total molar amount of the alcohols (which correspond to R groups) used, and an alcohol containing no amide linkage (which corresponds to $R^{2-2}$) is used in an amount of from 0 to 75 mole %, based on the total molar amount of the alcohols (which correspond to R groups) used, a photosensitive composition containing the polyimide precursor produced can provide a polyimide pattern film having not only excellent pattern resolution, but also excellent mechanical properties including high elongation and excellent water resistance upon being heat-cured.

When the first class of alcohol is used in an amount of less than 20 mole %, based on the total molar amount of the alcohols used, no appreciable improvement in pattern resolution can be obtained as compared to a conventional photosensitive polyimide precursor composition. Likewise, no appreciable improvement in elongation and water resistance of a polyimide coating film, obtained by heat treatment, can be achieved over conventional photosensitive polyimide precursor compositions. Accordingly, the second class of alcohol cannot be used in an amount of greater than 80 mole %, based on the total molar amount of the alcohols used.

When the second class of alcohol is used in an amount of less than 20 mole %, based on the total molar amount of the alcohols used, not only does the light sensitivity of the photosensitive composition become low, but also the resolution of a polyimide pattern obtained therefrom becomes unsatisfactory. Therefore, the first class of alcohol cannot be used in an amount of greater than 80 mole %, based on the total molar amount of the alcohols used.

As long as the requirement that each of the first and second classes of alcohols be used in an amount of 20 mole % or more, based on the total molar amount of the alcohols used, is satisfied, classes of alcohols other than those defined above, can be used in combination with the first and second classes of alcohols. Other classes of alcohols can be used in an amount of 60 mole % or less, preferably 50 mole % or less, more preferably 40 mole % or less, based on the total molar amount of the alcohols used. Representative examples of other classes of alcohols include n(iso)-butyl alcohol, n(iso)-amyl alcohol, n(cyclo)-hexyl alcohol, 2-methoxyethyl alcohol, 2-ethoxyethyl alcohol, 1-methoxy-2-propyl alcohol and mixtures thereof. The use of cellosolve type alcohols, such as 2-methoxyethyl alcohol etc., is effective for further improving the planar contour-forming ability of the ultimate polyimide resin.

When the first class of alcohols is used in an amount of 25 to 75 mole %, and the second class of alcohols is used in an amount of 25 to 75 mole %, each based on the total molar amount of the alcohols used, the resolution in patterning of a photosensitive composition containing a polyimide precursor produced using the two classes of alcohols becomes excellent, and the elongation and water resistance of a polyimide coating film obtained by heat treatment also become more excellent.

Therefore, use of 25 to 75 mole % of the first class alcohol and 25 to 75 mole % of the second class alcohol is more preferred.

Representative examples of photopolymerization initiators to be contained in a photosensitive composition of the present invention include benzophenone and derivatives thereof, such as methyl o-benzoylbenzoate, 4-benzoyl-4'-methyldiphenyl ketone, fluorenone, etc.; acetophenone derivatives, such as 2,2'-diethoxyacetophenone, 2-hydroxy-2-methylpropiophenone, etc.; 1-hydroxycyclohexyl phenyl ketone; thioxanthone and derivatives thereof, such as 2-methylthioxanthone, 2-isopropylthioxanthone, diethylthioxanthone, etc.; benzil and derivatives thereof, such as benzyldimethylketal, benzyl-β-methoxyethyl acetal, etc.; benzoin and derivatives thereof, such as benzoin methyl ether, etc.; azides, such as 2,6-di(4'-diazidobenzal)-4-methylcyclohexanone, 2,6'-di(4'-diazidobenzal)cyclohexanone, etc.; and oximes, such as 1-phenyl-1,2-butadione-2-(o-methoxycarbonyl)oxime, 1-phenyl-1,2-propanedione-2-(o-methoxycarbonyl)oxime, 1-phenyl-1,2-propanedione-2-(o-ethoxycarbonyl)oxime, 1-phenyl-1,2-propanedione-2-(o-benzoyl)oxime, 1,3-diphenyl-propanetrione-2-(o-ethoxycarbonyl)oxime and 1-phenyl-3-ethoxy-propane-trione- 2-(o-benzoyl)oxime. From the viewpoint of the light sensitivity, oximes are preferably used. An amount of a photopolymerization initiator to be contained in a photosensitive composition of the present invention is preferably 1 to 15 parts by weight per 100 parts by weight of the above mentioned polyimide precursor.

The photosensitive composition of the present invention can contain an additional compound having a reactive carbon-carbon double bond for improving the light sensitivity of the composition. Representative examples of additional compounds having a reactive carbon-carbon double bond include 1,6-hexanediol diacrylate, neopentyl glycol diacrylate, ethylene glycol diacrylate, polyethylene glycol diacrylate being an adduct of 2 to 20 ethylene glycol units, pentaerythritol diacrylate, dipentaerythritol hexaacrylate, tetramethylolmethane tetraacrylate, methylene-bis(acrylamide), N-methylolacrylamide, and methacrylates and methacrylamides corresponding to the acrylates and acrylamides mentioned above. The additional compound having a reactive carbon-carbon double bond is preferably added in an amount within the range of from 1 to 30 parts by weight per 100 parts by weight of a polyimide precursor.

Further, to the photosensitive composition of the present invention, a sensitizing agent can be added for improving the light sensitivity of the composition. Representative examples of sensitizing agents include Michler's ketone, 4,4'-bis(diethylamino)benzophenone, 2,5-bis(4'-diethylaminobenzal)cyclopentane, 2,6-bis-(4'-diethylaminobenzal)cyclohexanone, 2,6-bis(4'-dimethylaminobenzal)-4-methylcyclohexanone, 2,6-bis(4'-diethylaminobenzal)-4-methylcyclohexanone, 4,4'-bis(dimethylamino)chalcone, 4,4'-bis(diethylamino) chalcone, p-dimethylaminocinnamylideneindanone, p-dimethylaminobenzylideneindanone, 2-(p-dimethylaminophenylbiphenylene)-benzothiazole, 2-(p-dimethylaminophenylvinylene)-benzothiazole, 2-(p-dimethylaminophenylvinylene)-isonaphthothiazole, 1,3-bis(4'-dimethylaminobenzal)acetone, 1,3-bis(4'-diethylamino-benzal)acetone, 3,3-carbonyl-bis(7-diethylaminocoumarin), 3-acetyl-7-dimethylaminocoumarin, 3-ethoxycarbonyl-7-dimethylaminocoumarin, 3- benzyloxycarbonyl-7-dimethylaminocoumarin, 3-methoxycarbonyl-7-diethylaminocoumarin, 3-ethoxycarbonyl-7-diethylaminocoumarin, N-phenyl-N-ethylethanolamine, N-phenyldiethanolamine, N-ptolyldiethanolamine, N-phenylethanolamine, 4-morpholinobenzophenone, isoamyl dimethylaminobenzoate, isoamyl diethylaminobenzoate, 2-mercaptobenzimidazole, 1-phenyl- 5-mercaptotetrazole, 2-mercaptobenzothiazole, 2-(p-dimethylaminostyryl)benzoxazole, 2-(p-dimethylaminostyryl)benzthiazole, 2-(p-dimethylaminostyryl) naphtho(1,2-d)thiazole and 2-(p-dimethylaminobenzoyl) styrene. These sensitizing agents can be used individually or in combination. From the viewpoint of sensitivity of the agent, a compound having a mercapto group and a compound having a dialkylaminophenyl group are advantageously used in combination. An amount of a sensitizing agent to be added to a photosensitive composition of the present invention is preferably 0.1 to 10 parts by weight per 100 parts by weight of the polyimide precursor.

Moreover, for improving an adhesion property of the polyimide coating film to a substrate, an adhesion promoter can be added to the photosensitive composition of the present invention. Representative examples of adhesion promoters include γ-aminopropyldimethoxymethylsilane, N-(β-aminoethyl)-γ-aminopropylmethyldimethoxysilane, γ-glycidoxypropylmethyldimethoxysilane, γ-merchaptopropylmethyldimethoxysilane, 3-methacryloxypropyldimethoxymethylsilane, 3-methacryloxypropyltrimethoxysilane, dimethoxymethyl-3-piperidinopropylsilane, diethoxy-3-glycidoxypropylmethylsilane, N-(3-diethoxymethylsilylpropyl)-succinimide, N-[3-(triethoxysilylpropyl] phthalamic acid, benzophenone-3,3'-bis[N-(3-triethoxysilyl)-propylamido]-4,4'-dicarboxylic acid and benzene-1,4-bis[N-(3-triethoxysilyl)propylamido]-2,5-dicarboxylic acid. An amount of an adhesion promoter to be added to the photosensitive composition of the present invention is preferably 0.5 to 10 parts by weight per 100 parts by weight of the polyimide precursor.

Still further, for stabilizing the viscosity and light sensitivity of a solution of the composition during storage, a thermopolymerization inhibitor can be added to the photosensitive composition. Representative examples of thermopolymerization inhibitors include hydroquinone, N-nitrosodiphenylamine, p-t-butylcatechol, phenothiazine, N-phenylnaphthylamine, ethylenediaminetetraacetic acid, 1,2-cyclohexanediaminetetraacetic acid, glycoletherdiaminetetraacetic acid, 2,6-di-t-butyl-p-methylphenol, 5-nitroso-8-hydroxyquinoline, 1-nitroso-2-naphthol, 2-nitroso-1-naphthol, 2-nitroso-5-(N-ethyl-N-sulfopropylamino)phenol, N-nitro-so-N-phenylhydroxylamine ammonium salt and N-nitroso-N(1-naphthyl)hydroxylamine ammonium salt. An amount of a thermopolymerization inhibitor to be added to the photosensitive composition of the present invention is preferably 0.005 to 5 parts by weight per 100 parts by weight of the polyimide precursor.

As a solvent to be used for preparing a varnish form of the photosensitive composition of the present invention, a polar solvent is preferably used from the viewpoint of the ability to dissolve the photosensitive composition. Representative examples of solvents include N,N'-dimethylformamide, N-methylpyrrolidone, N-acetyl-2-pyrrolidone, N,N'-dimethylacetoamide, diethylene glycol dimethyl ether, cyclopentanone, γ-butyrolactone and α-acetyl-β-butyrolactone. These solvents can be used individually or in combination. An amount of a solvent to be used for preparing a solution of the photosensitive composition is preferably 100 to 400 parts by weight per 100 parts by weight of the polyimide precursor.

The photosensitive composition of the present invention can be applied to a substrate by means of a spin coater, a bar coater, a blade coater, a curtain coater, a screen printing press, a spraying coater or the like.

The coating film of the photosensitive composition on the substrate can be dried by an appropriate method, e.g., air-drying, heating in an oven or on a hot plate, and vacuum-drying.

The resultant coating film is subjected to exposure to ultraviolet rays etc. by using a light exposure machine, such as a contact aligner, a mirror projection aligner, a stepper, etc.

The imagewise exposed film can be developed by a conventional method customarily used for developing a photoresist, such as a spin-spray method, a puddle method (intermittent spray method), a dipping method with a supersonic wave, etc.

A developing liquid to be used for developing the imagewise exposed film is preferably a combination of a good solvent and a poor solvent for the polyimide precursor. Representative examples of good solvents include N-methylpyrrolidone, N-acetyl-2-pyrrolidone, N,N'-dimethylacetoamide, cyclopentanone, cyclohexanone, γ-butyrolactone and α-acetyl-γ-butyrolactone. Representative examples of poor solvents include toluene, xylene, methyl alcohol, ethyl alcohol, isopropyl alcohol and water. The ratio of the poor solvent to the good solvent is adjusted according to the solubility of the polyimide precursor to be used. With respect to each of good and poor solvents, different types of solvents can also be used in combination.

When resultant patterned film of the polyimide precursor is heated, moieties and components participating in the photopolymerization are evaporated-off, so that the polyimide precursor pattern film is converted to a cured polyimide resin pattern film. The heat curing can be carried out by a method, e.g., using a hot plate, an oven, a temperature programmed oven, etc. Inert gas, such as nitrogen and argon, and air may be used as an atmosphere in the treatment for heat curing the patterned film.

With the use of the polyimide precursor of the present invention or the photosensitive composition containing the same, the decrease in film thickness, which occurs at the heat curing of the patterned film, is small as compared to the decrease observed with respect to the conventional polymer composition disclosed in the above-mentioned Rubner et al. reference. It should further be noted that the polyimide coating film obtained using the polyimide precursor of the present invention has a high density as compared to that of the prior art film disclosed in the Rubner et al. reference. The polyimide coating pattern film obtained from the polyimide precursor of the present invention has not only a high resolution, but also a high elongation and a high water resistance, as compared to those of the polyimide coating pattern films of the prior art.

With respect to the polyimide precursor of the present invention, the concentration of organic groups having a terminal ethylenic double bond ($R^2$ groups), which are present in the precursor polymer, is low as compared to that of a conventional polyimide precursor as disclosed in the R. Rubner et al. reference. This fact would appear to suggest that the degree of photopolymerization by light exposure would be reduced to thereby lower the crosslinking density and, as a result, the difference in solubility between the exposed portion and the unexposed portion would become small, so that clear development would be difficult to perform; thus, the resolution of the pattern would be expected to become poor. However, the inventors have unexpectedly and surprisingly found that use of the polyimide precursor produces high-resolution polyimide patterns. On the other hand, when the organic groups containing a terminal ethylenic double bond ($R^2$ groups) are present in an amount of only less than 20 mole %, based on the total molar amount of the $R^1$ and $R^2$ groups, which is outside the scope of the present invention, the photosensitivity of a photosensitive composition is lowered, thereby decreasing the resolution of the resultant polyimide pattern film. This phenomenon is presumed to occur due to the low concentration of the $R^2$ groups.

The reasons for the improvement of the resolution of the polyimide pattern in the present invention, have not yet been fully elucidated, but are presumed to be the following:

(1) With respect to the photosensitive resin compositions, it is generally recognized that the lower the solubility of the photosensitive resin composition in a developer so that the time necessary for developing a pattern after light-exposure is long, the larger the difference in solubility between the exposed portion and the unexposed portion. The solubility of the precursor polymer of the present invention in a developer is lowered due to the introduction of organic groups having a low molecular weight to the side chain of the precursor polymer, so that a difference in solubility between the exposed portion and the unexposed portion can be easily achieved.

(2) the weight decrease of the polyimide precursor upon heat-curing is minimized, so that the decrease in thickness of the polyimide film is also minimized. This means that the polyimide pattern formed by heat-curing is capable of shape retention, so that the reproducibility of the polyimide film pattern is improved.

The polyimide coating film obtained from the photosensitive composition containing the polyimide precursor of the present invention is much improved with respect to the elongation and water resistance, as compared to those obtained from the conventional compositions. The reasons for this improvement have not been elucidated adequately, but are presumed to be due to the characteristic molecular orientation of the polyimide obtained from the polyimide precursor of the present invention by heat-curing, in view of the fact that the density of the heat-cured polyimide film is increased.

As described above, with use of the polyimide precursor and the photosensitive composition of the present invention, polyimide films, especially pattern films, having excellent properties, such as excellent elongation and high water resistance as well as high resolution of pattern can be obtained. Thus, the polyimide precursor of the present invention and the photosensitive composition containing the same are useful as new materials for the production of semiconductor devices, multi-layer wiring board and the like.

BEST MODE FOR CARRYING OUT THE INVENTION

Hereinbelow, the present invention will be described in detail with reference to the following Examples, Comparative Examples and Reference Examples, but they should not be construed to be limiting the scope of the present invention.

In the following examples, the viscosities of a polymer solution and a polymer composition were determined by conducting measurements at 23° C. using an E-type viscometer, VISCONIC-EMD, manufactured and sold by Tokyo Keiki Co., Ltd., Japan, and comparing measurement data with those obtained with respect to standard solutions for viscosity calibration (JS 2000, manufactured and sold by Showa Shell Sekiyu K.K., Japan).

In the following Examples and Comparative Examples, tensile strength and elongation were measured according to ASTM D-882-88.

EXAMPLE 1

Into a 2 liter separable flask were successively introduced 87.2 g of pyromellitic dianhydride, 62.4 g of 2-methacryloyloxyethyl alcohol, 14.7 g of ethyl alcohol and 320 ml of γ-butyrolactone to thereby obtain a mixture. To the thus obtained mixture was added 64.2 g of pyridine while agitating under ice-cooling, to thereby obtain a solution. After the termination of heat generation, the obtained solution was allowed to stand so that the temperature of the solution was lowered to room-temperature and then, further allowed to stand still for 16 hours. To the resultant solution was added a solution obtained by dissolving 166 g of dicyclohexylcarbodiimide in 120 ml of γ-butyrolactone, while agitating under ice cooling, over a period of 40 minutes, and subsequently added thereto a suspension prepared by suspending 74.5 g of 4,4'-diaminodiphenylether in 150 ml of γ-butyrolactone, while agitating under ice cooling, over a period of 60 minutes, to thereby obtain a mixture. The mixture was agitated at room temperature for 2 hours. To the mixture was added 30 ml of ethyl alcohol, followed by agitation for 1 hour to obtain a reaction mixture. Thereto were added 250 ml of dimethylacetamide and 400 ml of tetrahydrofuran, each as diluent, to thereby obtain a mixture containing a precipitate. The precipitate in the mixture was filtered off, and to the resultant supernatant was added to 15 liters of ethyl alcohol to form a precipitate. The precipitate was filtered off and vacuum-dried, thereby obtaining a polymer powder. The obtained polymer powder is referred to as "T-40". The viscosity of a 30% by weight solution of T-40 in N-methylpyrrolidone was 23.1 ps (poises).

50 g of T-40, 2 g of 1-phenyl-3-ethoxypropanetrione-2-(o-benzoyl)oxime, 0.1 g of Michler's ketone, 3 g of diethylene glycol diacrylate, 1 g of 2-mercaptobenzothiazole, 2 g of N-phenyldiethanolamine, 0.5 g of 3-methacryloxypropyldimethoxymethylsilane and 0.02 g of 2-nitroso-1-naphthol were dissolved in 84.4 g of N-methylpyrrolidone to thereby prepare a photosensitive composition. The prepared composition (varnish) is referred to as "WT-40". The viscosity of WT-40 was 131 ps.

WT-40 was spin-coated on a silicon wafer and dried in an oven at 80° C. for 80 minutes to obtain a uniform coating film having a thickness of 40 μm. The coating film on the wafer was exposed to UV light for 100 seconds through a photomask bearing a test pattern, which was hard-contacted with the coating film under a suction pressure of 55 cm Hg, using a contact-aligner (equipped with a 250 W extra-high pressure mercury lamp), PLA 501 F manufactured and sold by Canon Inc., Japan. Then, the exposed film was subjected to developing by means of a developing machine for puddle method, D-SPIN 636 manufactured and sold by Dainippon Screen Manufacturing Co., Ltd., Japan, using a mixed solvent of cyclohexanone and methanol (at a volume ratio of 49/1) as a developer and isopropyl alcohol as a rinse, to thereby obtain a pattern of a polyimide precursor. The developed pattern film on the wafer was heated first at 200° C. for 1 hour and then at 350° C. for 3 hours under nitrogen atmosphere in a temperature-programmed curing furnace, VF-2000, manufactured and sold by Koyo Lindberg Co., Ltd., Japan, to form a 23 μm-thick polyimide pattern film. In the obtained pattern, via-holes having a square of 20 μm×20 μm were formed.

To the obtained polyimide pattern film on the wafer was adhered a pin of 2 mm in diameter, using an epoxy adhesive, "Araldite ® standard" manufactured and sold by Showa Highpolymer Co., Ltd. , Japan. Then, pulling tests were conducted using a pulling tester, SEBASTIAN 5 type manufactured and sold by Quad Company Group, U.S.A. The epoxy resin adhesive was broken, and the pulling stress was found to be more than 8 kg/mm². Separately, another sample of the above-mentioned polyimide film on the wafer was placed and left in a pressure-cooker under conditions of 133° C., 2 kg/mm² and 100% RH, and then dried at 60° C. for 20 minutes to conduct a pulling test in substantially the same manner as described above. A pulling stress was maintained at 6 kg/mm². Thus, it was found that the water resistance of the adhesion of the polyimide film to the wafer was satisfactory.

Separately, WT-40 was spin-coated on a silicon wafer and heat-dried in substantially the same manner as described above to obtain a uniform coating film on the wafer. The whole area of the coating film on the wafer was exposed to UV light. The exposed film on the wafer was directly heated in substantially the same manner as described above to obtain a polyimide film. The obtained polyimide film on the wafer was cut into strip-form specimens each having a width of 3 mm, using a dicing saw, DAD-2H 16T manufactured and sold by Disco Co., Ltd.. From the obtained specimens, polyimide films were peeled off using 20% hydrofluoric acid to obtain polyimide tapes. The obtained polyimide tapes were subjected to measurement of mechanical properties using a tensile machine, TENSILON, UTM-II-Type 20 manufactured and sold by Toyo Baldwin Co., Ltd., Japan. The tensile strength and elongation of the polyimide film were 14 kg/mm² and 72%, respectively.

Separately, another sample of the above-mentioned polyimide film on the silicon wafer was placed and left in a pressure-cooker under conditions of 133° C., 2 kg/mm² and 100 % RH, and then dried at 60° C. for 20 minutes to conduct a pulling test in substantially the same manner as described above. The tensile strength and elongation of the polyimide film were 12 kg/mm² and 57%, respectively, which were both satisfactory. Thus, a satisfactory water resistance was confirmed with respect to the mechanical properties of the films prepared from WT-40.

EXAMPLE 2–4 AND COMPARATIVE EXAMPLES 1–3

Substantially the same procedure as described in Example 1 for the preparation of the polymer powder was repeated except that the amounts of 2-methacryloyloxyethyl alcohol (HEMA) and ethyl alcohol (EtOH) were changed. However, in Examples 3 and 4, and Comparative Example 3, immediately after the addition of 4,4'-diaminodiphenylether, 250 ml of dimethylacetamide was added, that is, the order of the addition of these two substances was changed. The amounts of the alcohols, the designations of the obtained polymers, and viscosities of 30% by weight solutions of each of the polymers in N-methylpyrrolidone are shown in Table 1. Subsequently, the same amounts of the same materials were used to prepare photosensitive compositions except that the amount of N-methylpyrrolidone was changed in each of the Examples 2–4 and Comparative Examples 1–3. The designations of the compositions, the amounts of N-methylpyrrolidone (NMP) and the viscosities of the compositions are shown in Table 1.

TABLE 1

| | HEMA (g) | EtOH (g) | Designation of Polymer | Viscosity of 30 wt % Solution (ps) | Designation of Composition | Amount of NMP (g) | Viscosity of Composition (ps) |
| --- | --- | --- | --- | --- | --- | --- | --- |
| Example 2 | 78 | 9.2 | T-25 | 20.8 | WT-25 | 82.2 | 122 |
| Example 3 | 34.3 | 24.7 | T-67 | 28.5 | WT-67 | 88.5 | 127 |
| Example 4 | 20.8 | 29.4 | T-80 | 24.0 | WT-80 | 85.2 | 125 |
| Comparative Example 1 | 104 | 0 | T-0 | 15.1 | WT-0 | 76.6 | 125 |
| Comparative Example 2 | 88.4 | 5.5 | T-15 | 17.2 | WT-15 | 78.5 | 130 |
| Comparative Example 3 | 0 | 36.8 | T-100 | 22.5 | WT-100 | 84.0 | 130 |

In the column of "Designation of Polymer", for example, "T-25" means that 25 mole % of ethyl groups and 75 mole % of 2-methacryloyloxyethyl groups are contained in the polymer.

Employing individually each of the obtained photosensitive compositions (varnishes), uniform coating films having a thickness of 40 μm were prepared on silicon wafers in substantially the same manner as in Example 1. From the thus prepared coating films on the wafers, a polyimide pattern film and tapes of polyimide were obtained in substantially the same manner as in Example 1. The thickness of the coating film of the obtained pattern, the size of minimum via-hole formed (resolution), pulling stresses of the films before and after a pressure-cooker treatment (PCT), and mechanical properties of the polyimide films before and after a pressure-cooker treatment (PCT) were measured. The results are shown in Table 2 together with the designations of varnishes used.

TABLE 2

| Designation of Varnish | Film Thickness (μm) | Resolution (μm) | Pulling Stress (kg/mm²) | | Mechanical Strength (kg/mm²) | | Elongation at Break (%) | |
|---|---|---|---|---|---|---|---|---|
| | | | Before PCT | After PCT | Before PCT | After PCT | Before PCT | After PCT |
| WT-25 | 22 | 30 | 8 | 5 | 14 | 12 | 65 | 55 |
| WT-67 | 24 | 20 | >8 | 7 | 12 | 12 | 50 | 45 |
| WT-80 | 25 | 35 | >8 | 7 | 12 | 12 | 50 | 45 |
| WT-0 | 21 | 40 | 6 | 1 | 13 | 7 | 35 | 3 |
| WT-15 | 21 | 40 | 7 | 2 | 13 | 8 | 40 | 7 |
| WT-100 | 26 | 50 | >8 | 7 | 13 | 13 | 40 | 35 |

EXAMPLES 5–8 AND COMPARATIVE EXAMPLES 4–6

Into a 2 liter separable flask were successively introduced 26.2 g of pyromellitic dianhydride, 90.2 g of 3,3′,4,4′-benzophenonetetracarboxylic dianhydride, 320 ml of γ-butyrolactone, and 2-methacryloyloxyethyl alcohol (HEMA) and methyl alcohol (MeOH) both in amounts indicated in Table 3 to thereby obtain a mixture. To the thus obtained mixture was added 64.2 g of pyridine while agitating under ice cooling, to thereby obtain a solution. After the termination of heat generation, the solution was allowed to stand so that the temperature of the solution is lowered to room temperature and then, further allowed to stand still for 16 hours. To the resultant solution was added dicyclohexylcarbodiimide in substantially the same manner as in Example 1, and subsequently added thereto a suspension prepared by suspending 52.2 g of 4,4′-diaminodiphenylether and 11.6 g of methaphenylenediamine in 150 ml of γ-butyrolactone, in substantially the same manner as in Example 1 to thereby obtain a mixture. The mixture was subjected to further treatments, which are described in Example 1, to thereby obtain a polymer powder. The amounts of the alcohols, the designations of the obtained polymers and viscosities of 30% by weight solutions of the obtained polymers in N-methyl-pyrrolidone are shown in Table 3.

Each of the above-mentioned compositions was individually spin-coated on a silicon wafer and dried on a hot plate at 100° C. for 240 seconds to obtain a uniform coating film having a thickness of 15 μm. The coating film on the wafer was exposed to UV light for 1.4 seconds through a test pattern, using a stepper (equipped with a 500 W extra-high pressure mercury lamp), NSR 1505 G2A manufactured and sold by Nikon Corporation, Japan. Then, the exposed coating film on the silicon wafer was subjected to spray developing by means of a developing machine as described in Example 1, using a mixed solvent of N-methylpyrrolidone, xylene and water (at a volume ratio of 12/12/1) as a developer, and a mixed solvent of xylene and isopropyl alcohol (at a volume ratio of 50/50) as a rinse, to thereby obtain a pattern of the polyimide precursor. The exposed film on the silicon wafer was heated first at 140° C. for 1 hour and then at 350° C. for 1 hours under nitrogen atmosphere in substantially the same curing furnace as described in Example 1, to form a polyimide pattern film on the silicon wafer.

Employing individually each of the above-obtained photosensitive compositions, a uniform polyimide coating film was prepared on a silicon wafer in substantially the same manner as in Example 1. From the thus prepared polyimide coating film on the wafer, polyimide tapes were obtained in substantially the same manner as in Example 1. Samples of the obtained polyimide tapes

TABLE 3

| | HEMA (g) | EtOH (g) | Designation of Polymer | Viscosity of 30 wt % Solution (ps) | Designation of Composition | Amount of NMP (g) | Viscosity of Composition (ps) |
|---|---|---|---|---|---|---|---|
| Example 5 | 83.2 | 5.1 | C-20 | 13.8 | XC-20 | 97 | 28.8 |
| Example 6 | 62.4 | 10.2 | C-40 | 12.3 | XC-40 | 93 | 35.8 |
| Example 7 | 34.3 | 17.2 | C-67 | 15.2 | XC-67 | 97 | 33.2 |
| Example 8 | 26 | 19.2 | C-75 | 14.0 | XC-75 | 97 | 30.1 |
| Comparative Example 4 | 104 | 0 | C-0 | 15.8 | XC-0 | 97 | 35.2 |
| Comparative Example 5 | 15.6 | 21.8 | C-85 | 15.0 | XC-85 | 97 | 32.3 |
| Comparative Example 6 | 0 | 25.6 | C-100 | 14.0 | XC-100 | 97 | 29.6 |

In the column of "Designation of Polymer", for example, "C-20" means that 20 mole % of ethyl groups and 80 mole % of 2-methacryloyloxyethyl groups are contained in the polymer.

From 50 g of each of polymers indicated in Table 3, 3 g of benzophenone, 0.2 g of 4,4′-bis(diethylamino)benzophenone, 2.5 g of benzyldimethylketal, 4 g of pentaerythritol triacrylate, 2 g of 1-phenyl-5-mercaptotetrazole, 0.5 g of γ-aminopropyltrimethoxysilane, 0.003 g of ethylenediaminetetraacetic acid, and N-methylpyrrolidone (NMP) in an amount indicated in Table 3, photosensitive compositions were prepared. The designations and viscosities of the obtained compositions are indicated in Table 3.

as well as the above-obtained polyimide pattern were subjected to the evaluation in substantially the same manner as in Example 1. The thickness of the coating film of the obtained pattern, the size of minimum viahole formed (resolution), pulling stress of the polyimide film before and after a pressure-cooker treatment (PCT), and mechanical properties of the polyimide films before and after a pressure-cooker treatment (PCT) were measured in substantially the same manner as on Example 1. The thus obtained results are shown in Table 4 together with the designations of varnishes used.

TABLE 4

| Designation of Varnish | Thickness (μm) | tion (μm) | (kg/mm²) Before PCT | (kg/mm²) After PCT | (kg/mm²) Before PCT | (kg/mm²) After PCT | at Break (%) Before PCT | at Break (%) After PCT |
|---|---|---|---|---|---|---|---|---|
| XC-20 | 8.3 | 10 | >8 | 8 | 13 | 12 | 30 | 20 |
| XC-40 | 8.6 | 8 | >8 | >8 | 13 | 12 | 40 | 35 |
| XC-67 | 8.9 | 8 | >8 | >8 | 12 | 12 | 45 | 40 |
| XC-75 | 9.0 | 10 | >8 | >8 | 13 | 12 | 40 | 35 |
| XC-0 | 8.0 | 15 | >8 | 6 | 12 | 11 | 20 | 10 |
| XC-85 | 9.3 | 15 | >8 | >8 | 12 | 11 | 45 | 40 |
| XC-100 | 9.5 | 30 | >8 | >8 | 13 | 12 | 45 | 40 |

EXAMPLE 9

Into a 2 liter separable flask were successively introduced 117.6 g of 3,3',4,4'-biphenyltetracarboxylic dianhydride, 55.7 g of 2-acryloyloxyethyl alcohol, 18.6 g of allyl alcohol, 320 ml of γ-butyrolactone and 64.2 g of pyridine to thereby obtain a mixture. The thus obtained mixture was agitated at 40° C. for 2 hours to thereby obtain a uniform solution. Subsequently, to the solution was added dicyclohexylcarbodiimide in substantially the same manner as in Example 1. Thereto was added 250 ml of N,N-dimethylacetamide containing 38.7 g of p-phenylenediamine, while agitating under ice cooling, over a period of 40 minutes. Subsequently, in substantially the same manner as in Example 1, a polymer powder was obtained. The obtained polymer powder is referred to as "U-40". The viscosity of a 30% by weight solution of U-40 in N-methylpyrrolidone was 18.0 ps. The designation of polymer, "U-40" means that 40 mol % of allyl groups and 60 mol % of 2-acryloyloxyethyl groups are contained in the polymer.

A photosensitive composition was prepared in substantially the same manner as in Example 5 except that 50 g of U-40 was used instead of C-20. The obtained composition is referred to as "XU-40". The viscosity of XU-40 was 36.5 ps. XU-40 was evaluated in substantially the same manner as in Example 5. The obtained polyimide pattern was 8.0 μm thick, and the resolution was 8 μm. The pulling stresses before and after a pressure-cooker treatment (PCT) were 6 and 5 kg/mm², respectively. The mechanical strengths before and after PCT were 16 and 14 kg/mm², respectively. The elongations before and after PCT were 35 and 25%, respectively.

COMPARATIVE EXAMPLE 7

A polymer powder was obtained in substantially the same manner as in Example 9 except that 92.8 g of 2-acryloyloxyethyl alcohol was used without using allyl alcohol. The obtained polymer powder is referred to as "U-0". The viscosity of a 30% by weight solution of U-0 in N-methylpyrrolidone was 20.3 ps. A photosensitive composition was prepared in substantially the same manner as in Example 9 except that U-0 was used instead of U-40. The prepared composition is referred to as "XU-0". The viscosity of XU-0 was 40.8 ps. XU-0 was evaluated in substantially the same manner as in Example 5. The obtained polyimide pattern was 7.3 μm thick, and the resolution was 15 μm. The pulling stresses before and after a pressure-cooker treatment (PCT) were 5 and 1 kg/mm², respectively. The mechanical strengths before and after PCT were 16 and 13 kg/mm², respectively The elongations before and after PCT were 20 and 5%, respectively.

COMPARATIVE EXAMPLE 8

Preparation of a polymer was attempted in substantially the same manner as in Comparative Example 7 except that 46.4 g of allyl alcohol was used without using 2-acryloyloxyethyl alcohol. However, the obtained reaction solution solidified into gel, thereby rendering it impossible to obtain a precipitate of a polymer by addition of ethyl alcohol. A polymer powder was not obtained.

EXAMPLE 10

Into a 2 liter separable flask were successively introduced 26.2 g of pyromellitic dianhydride, 90.2 g of 3,3',4,4'-benzophenonetetracarboxylic dianhydride, 41.6 g of 1-acryloyloxy-2-propyl alcohol, 28.8 g of 2-ethoxyethyl alcohol, 9.6 g of n-propyl alcohol and 320 ml of γ-butyrolactone to obtain a mixture. The mixture was treated in substantially the same manner as in Example 1 to thereby obtain a polymer powder. The obtained polymer powder is referred to as "CE-442". The viscosity of a 30% by weight solution of CE-442 in N-methylpyrrolidone was 24.1 ps. In the CE-442, 20 mol % of n-propyl groups which correspond to $R^1$, 40 mol % of 1-acryloyloxy-2-propyl groups which correspond to $R^2$, and 40 mol % of 2-ethoxyethyl groups.

A photosensitive composition was prepared in substantially the same manner as in Example 5 except that 50 g of CE-442 was used instead of C-20. The obtained composition is referred to as "XCE-442". The viscosity of XCE-442 was 39.8 ps. XCE-442 was evaluated in substantially the same manner as in Example 5. The obtained polyimide pattern was 8.2 μm thick, and the resolution was 8 μm. The pulling stresses before and after a pressure-cooker treatment (PCT) were 8 and 8 kg/mm², respectively. The mechanical strengths before and after PCT were 13 and 14 kg/mm², respectively. The elongations before and after PCT were 50 and 45%, respectively.

COMPARATIVE EXAMPLE 9

A polymer powder was obtained in substantially the same manner as in Example 10 except that 104 g of 1-acryloyloxy-2-propyl alcohol was used and neither of 2-ethoxyethyl alcohol and n-propyl alcohol was used. The obtained polymer powder is referred to as "CE-0". The viscosity of a 30% by weight solution of CE-0 in N-methylpyrrolidone was 22.1 ps.

A photosensitive composition was prepared in substantially the same manner as in Example 5 except that 50 g of CE-0 was used instead of C-20. The prepared composition is referred to as "XCE-0". The viscosity of XCE-0 was 38.8 ps. XCE-0 was evaluated in substantially the same manner as in Example 5. The obtained polyimide pattern was 7.8 μm thick, and the resolution was 15 μm. The pulling stresses before and after a pressure-cooker treatment (PCT) were 8 and 5 kg/mm$^2$, respectively. The mechanical strengths before and after PCT were 13 and 13 kg/mm$^2$, respectively. The elongations before and after PCT were 20 and 10%, respectively.

REFERENCE EXAMPLE 1

Each of T-0, T-15, T-25, T-40, T-67, T-80 and T-100 was individually dissolved in N-methylpyrrolidone to thereby obtain 30% by weight solutions. Each of the obtained solutions was individually spin-coated on a silicon wafer and dried in an oven at 80° C. for 40 minutes to obtain a uniform coating film of a polyimide precursor on the wafer. The coating film on the wafer was peeled off to obtain a film. The obtained film was introduced in a tube in which a density gradient is formed using carbon tetrachloride and xylene to determine the density of the film. The determined densities of the films obtained from T-0, T-15, T-25, T-40, T-67, T-80 and T-100 were 1.328, 1.331, 1.333, 1.337, 1.344, 1.348 and 1.355 g/cm$^3$, respectively.

REFERENCE EXAMPLE 2

The densities of polyimide tapes obtained from XC-0, XC-20, XC-40, XC-67 and XC-100 were determined in substantially the same manner as in Reference Example 1. The determined densities of the polyimide tapes obtained from XC-0, XC-20, XC-40, XC-67 and XC-100 were 1.409, 1.413, 1.417, 1.418 and 1.417 g/cm$^3$, respectively.

COMPARATIVE EXAMPLE 10

A polymer powder was obtained in substantially the same manner as in Example 6 except that 5.8 g of m-phenylenediamine and 13.3 g of bis(3-aminopropyl)tetramethyldisiloxane were simultaneously used. The obtained polymer powder is referred to as "S-40". The viscosity of a 30% by weight solution of S-40 in N-methylpyrrolidone was 9.8 ps.

A photosensitive composition was prepared in substantially the same manner as in Example 6 except that S-40 was used instead of C-40. The prepared composition is referred to as "XS-40". The viscosity of XS-40 was 28.2 ps. Attempts were made to obtain polyimide patterns using XS-40 in substantially the same manner as in Example 6. However, the decrease in a thickness at the exposed portions and the dissolution-out of the polymer during developing were both so severe that satisfactory patterns could not be obtained. Separately, polyimide tapes were obtained using XS-40 in substantially the same manner as in Example 6. The elongation of the tape before a pressure-cooker treatment (PCT) was 10%. However, the elongation after PCT was too small to measure.

COMPARATIVE EXAMPLE 11

A photosensitive composition was prepared in substantially the same manner as in Example 1 except that 30 g of T-0 and 20 g of T-100 were simultaneously used instead of 50 g of T-40. The prepared composition is referred to as "WM-40". The viscosity of WM-40 was 120 ps. Using WM-40, a polyimide pattern having a thickness of 23 μm was obtained in substantially the same manner as in Example 1. The resolution was 35 μm. The pulling stresses before and after a pressure-cooker treatment (PCT) were 8 and 6 kg/mm$^2$, respectively. Separately, polyimide tapes were obtained using WM-40 in substantially the same manner as in Example 1. With respect to the mechanical properties of the obtained polyimide tapes, the tensile strength and elongation were 14 kg/mm$^2$ and 60%, respectively, and the tensile strength and elongation after PCT were 13 kg/mm$^2$ and 50%, respectively. Each of WM-40, WT-0, WT-15, WT-25, WT-40, WT-67, WT-80 and WT-100 was treated by cooling in a manner such that each composition was allowed to stand still at 0° C. for 10 days. Then, each of them was returned to room temperature. Using each composition thus subjected to cooling, it was attempted to form polyimide precursor patterns in the same manner as in Example 1. With respect to each of cooling-treated WT-0, WT-15, WT-25, WT-40 and WT-67, polyimide precursor patterns could be obtained under the same conditions as in Example 1. These patterns were comparable to those obtained from the same types of compositions which, however, had not been subjected to prior cooling. With respect to WT-80, it took a 1.2 times longer to perform development; however, the polyimide precursor patterns obtained were comparable to those obtained from untreated WT-80, were obtained. With respect to WM-40 and WT-100 treated by prior cooling, small particles precipitated to thereby render the compositions turbid and satisfactory polyimide precursor patterns were not obtained.

EXAMPLES 11–15 AND COMPARATIVE EXAMPLES 12–13

Into a 2 liter separable flask were successively introduced 260 ml of γ-butyrolactone, 64.2 g of pyridine, 13.8 g of methacrylic acid, and further added thereto, while agitating under ice cooling, a solution of 33.0 g of dicyclohexylcarbodiimide in 30 ml of γ-butyrolactone, and then added thereto a solution of 9.8 g of ethanolamine in 30 ml of γ-butyrolactone, to thereby obtain a suspension containing a precipitate. The suspension was allowed to stand still for 1 hour to thereby prepare 2-methacrylamidoethyl alcohol. To the prepared 2-methacrylamidoethyl alcohol were added, while agitating, 87.2 g of pyromellitic dianhydride, and 2-methacryloyloxyethyl alcohol (HEMA) and ethyl alcohol (EtOH) both in amounts indicated in Table 5. After the termination of heat generation, the resultant suspension contained a precipitate; it was allowed to stand so that the temperature of the suspension was lowered to room temperature and then allowed to stand still for additional 16 hours. Subsequently, a polymer powder was obtained in substantially the same manner as in Example 3.

The amounts of the alcohols, the designations of the obtained polymers, and the viscosities of 30% by weight solutions of the obtained polymers in N-methylpyrrolidone are shown in Table 5.

Subsequently, photosensitive compositions were prepared using the same amounts of the same materials as used in Example 1 except that the amount of N-methylpyrrolidone was changed in each of the Examples 11–15 and Comparative Examples 12–14. The designations of the compositions, the amounts of N-methylpyrrolidone and the viscosities of the compositions are also shown in Table 5.

TABLE 5

| | HEMA (g) | EtOH (g) | Designation of Polymer | Viscosity of 30 wt % Solution (ps) | Designation of Composition | Amount of NMP (g) | Viscosity of Composition (ps) |
| --- | --- | --- | --- | --- | --- | --- | --- |
| Comparative Example 12 | 83.2 | 0 | 2T-0 | 17.3 | W2T-0 | 78.5 | 127 |
| Comparative Example 13 | 67.6 | 5.5 | 2T-15 | 19.3 | W2T-15 | 77.0 | 130 |
| Example 11 | 62.4 | 7.3 | 2T-20 | 20.8 | W2T-20 | 82.3 | 123 |
| Example 12 | 57.2 | 9.2 | 2T-25 | 20.8 | W2T-25 | 82.0 | 122 |
| Example 13 | 41.6 | 14.7 | 2T-40 | 27.9 | W2T-40 | 86.0 | 125 |
| Example 14 | 13.5 | 24.7 | 2T-67 | 26.3 | W2T-67 | 88.0 | 130 |
| Example 15 | 0 | 29.4 | 2T-80 | 25.0 | W2T-80 | 85.0 | 125 |

In the column of "Designation of Polymer", for example, "2T-40" means that 20 mole % of 2-methacrylamidoethyl groups, 40 mole % of ethyl groups and 40 mole % of 2-methacryloyloxyethyl groups are contained in the polymer.

Employing individually each of the obtained photosensitive compositions (varnishes), a uniform coating film having a thickness of 40 μm was prepared on a silicon wafer in substantially the same manner as in Example 1. From the prepared coating film on the wafer, a pattern and tapes of polyimide were obtained in substantially the same manner as in Example 1. The thickness of the polyimide coating film of the obtained pattern, the size of minimum via-hole formed (resolution), the pulling stresses of the polyimide films before and after a pressure-cooker treatment (PCT), and the mechanical properties (tensile strength and elongation) of the polyimide film before and after a pressure-cooker treatment (PCT) were measured. The results obtained are shown in Table 6 together with the designations of varnishes used.

tained in substantially the same manner as in Example 11 except that 20.8 g of 2-methacryloyloxyethyl alcohol was used. The polymer powder is referred to as "4T-40".

The designations of the obtained polymers, and viscosities of 30% by weight solutions of the polymers in N-methylpyrrolidone are shown in Table 7.

Subsequently, the same amounts of the same materials as used in Example 1 were employed, except that the amount of N-methylpyrrolidone was changed in each of the Examples 16 and 17, to thereby prepare photosensitive compositions. The designations of the compositions, the amounts of N-methylpyrrolidone and the viscosities of the compositions are shown in Table 7.

TABLE 7

| | Designation of Polymer | Viscosity of 30 wt % Solution (ps) | Designation of Composition | Amount of NMP (g) | Viscosity of Composition (ps) |
| --- | --- | --- | --- | --- | --- |
| Example 16 | 1T-40 | 25.0 | W1T-40 | 84.5 | 122 |
| Example 17 | 4T-40 | 28.5 | W4T-40 | 88.5 | 125 |

In the column of "Designation of Polymer", for example, "1T-40" means that 10 mole % of 2-methacrylamidoethyl groups, 40 mole % of ethyl groups and 50 mole % of 2-methacryloyloxyethyl groups are contained in the polymer.

Employing individually each of the obtained photosensitive compositions (varnishes), a uniform coating

TABLE 6

| Designation of Varnish | Film Thickness (μm) | Resolution (μm) | Pulling Stress (kg/mm²) | | Tensile Strength (kg/mm²) | | Elongation at Break (%) | |
| --- | --- | --- | --- | --- | --- | --- | --- | --- |
| | | | Before PCT | After PCT | Before PCT | After PCT | Before PCT | After PCT |
| W2T-0 | 21 | 40 | 8 | 3 | 13 | 10 | 40 | 10 |
| W2T-15 | 22 | 35 | 8 | 4 | 13 | 11 | 45 | 20 |
| W2T-20 | 23 | 20 | 8 | 8 | 13 | 12 | 60 | 50 |
| W2T-25 | 22 | 15 | >8 | >8 | 13 | 13 | 70 | 70 |
| W2T-40 | 22 | 10 | >8 | >8 | 13 | 13 | 65 | 65 |
| W2T-67 | 23 | 10 | >8 | >8 | 13 | 13 | 70 | 70 |
| W2T-80 | 20 | 20 | >8 | 8 | 12 | 12 | 50 | 45 |

EXAMPLES 16 AND 17

2-methacrylamidoethyl alcohol was prepared in substantially the same manner as in Example 11 except that 6.9 g of methacrylic acid and 16.5 g of dicyclohexylcarbodiimide and 4.9 g of ethanolamine were used. Subsequently, a polymer powder was obtained in substantially the same manner as in Example 11 except that 52.0 g of 2-methacryloyloxyethyl alcohol was used. The obtained polymer powder is referred to as "1T-40". Separately, 2-methacrylamidoethyl alcohol was prepared in substantially the same manner as in Example 11 except that 27.6 g of methacrylic acid and 66.0 g of dicyclohexylcarbodiimide and 19.6 g of ethanolamine were used. Subsequently, a polymer powder was obfilm having a thickness of 40 μm was prepared on a silicon wafer in substantially the same manner as in Example 1. From the prepared coating film on the wafer, a pattern and tapes of polyimide were obtained in substantially the same manner as in Example 1. The thickness of the coating film of the obtained polyimide pattern, the size of minimum via-hole formed (resolution), the pulling stresses of the polyimide films before and after a pressure-cooker treatment (PCT), and the mechanical properties (tensile strength and elongation) of the polyimide films before and after a pressure-cooker treatment (PCT) were measured in substantially the same manner as in Example 1. The results obtained are shown in Table 8 together with the designations of varnishes used.

TABLE 8

| Designation of Varnish | Film Thickness (μm) | Resolution (μm) | Pulling Stress (kg/mm²) | | Tensile Strength (kg/mm²) | | Elongation at Break (%) | |
|---|---|---|---|---|---|---|---|---|
| | | | Before PCT | After PCT | Before PCT | After PCT | Before PCT | After PCT |
| W1T-40 | 23 | 15 | 8> | 8> | 13 | 13 | 70 | 65 |
| W4T-40 | 23 | 10 | 8> | 8> | 13 | 13 | 70 | 70 |

REFERENCE EXAMPLE 3

With respect to each of 2T-0, 2T-15, 2T-20, 2T-25, 2T-40, 2T-67, 2T-80, 1T-40 and 4T-40, the densities of polyimide precursor films obtained therefrom in substantially the same manner as in Reference Example 1 were determined in substantially the same manner as in Reference Example 1. The densities of the polyimide precursor films obtained from 2T-0, 2T-15, 2T-20, 2T-25, 2T-40, 2T-67, 2T-80, 1T-40 and 4T-40 were 1.331, 1.332, 1.334, 1.338, 1.342, 1.349, 1.354, 1,339 and 1.345, respectively.

INDUSTRIAL APPLICABILITY

The polyimide precursor of the present invention has excellent pattern-forming properties and can be converted by heating to a cured polyimide resin having excellent mechanical properties including high elongation properties; it is thus useful as a raw material for the production of electrical and electronic parts, such as semiconductor devices, multilayer wiring boards, etc. The photosensitive resin composition containing this novel polyimide precursor according to the present invention is particularly useful for forming a polyimide resin patterned film having excellent mechanical strengths and a high water resistance as well as a high pattern resolution.

We claim:

1. A polyimide precursor comprising recurring units represented by the following formula (I):

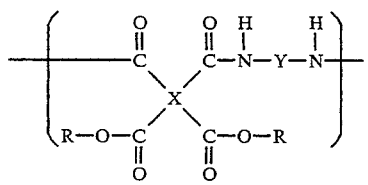

wherein X represents a tetravalent aromatic group having 4 to 24 carbon atoms;
   Y represents a divalent aromatic group having 4 to 36 carbon atoms; and
   the R groups comprise 20 to 80 mole %, based on the total molar amount of the R groups, of $R^1$ groups and 20 to 80 mole %, based on the total molar amount of the R groups, of $R^2$ groups;
   said $R^1$ groups being each independently selected from the group consisting of a methyl group, an ethyl group, an n-propyl group, an isopropyl group and an allyl group;
   said $R^2$ groups being each independently selected from organic groups having 4 to 11 carbon atoms and containing a terminal ethylenic double bond; and
   wherein each of the —COOR groups is bonded to X at the ortho-position relative to the respective neighboring —CONH— group;
   said polyimide precursor having a viscosity of from 1 to 1,000 poises as measured at 23° C. with respect to a 30% by weight solution of the precursor in N-methylpyrrolidone.

2. The polyimide precursor according to claim 1, wherein each of said $R^2$ groups has 5 to 7 carbon atoms.

3. The polyimide precursor according to claim 1, wherein said $R^1$ groups and said $R^2$ groups are, respectively, present in proportions of from 25 to 75 mole % and from 25 to 75 mole %, based on the total molar amount of said R groups.

4. The polyimide precursor according to claim 1, wherein said 20 to 80 mole % $R^2$ groups consist of 5 to 40 mole %, based on the total molar amount of said R groups, of $R^{2-1}$ groups selected from organic groups having 4 to 11 carbon atoms and containing a terminal ethylenic double bond and an amido linkage, and 0 to 75 mole %, based on the total molar amount of said R groups, of $R^{2-2}$ groups selected from organic groups having 4 to 11 carbon atoms and containing a terminal ethylenic double bond and no amido linkage.

5. The polyimide precursor according to claim 1, wherein said R groups further comprise 60 mole % or less, based on the total molar amount of said R groups, of organic groups other than said $R^1$ groups and said $R^2$ groups.

6. The polyimide precursor according to claim 5, wherein said organic groups other than said $R^1$ groups and said $R^2$ groups are selected from the group consisting of n-butyl, isobutyl, n-amyl, isoamyl, n-hexyl, cyclohexyl, 2-methoxyethyl, 2-ethoxyethyl, 1-methoxy-2-propyl and mixtures thereof.

7. A photosensitive composition which is a varnish comprising (A) a polyimide precursor according to any one of claims 1 to 6, (B) a photopolymerization initiator and (C) a solvent for components (A) and (B).

* * * * *